US008089198B2

(12) United States Patent
Bianchini

(10) Patent No.: US 8,089,198 B2
(45) Date of Patent: Jan. 3, 2012

(54) PIEZOELECTRIC LOUDSPEAKER

(75) Inventor: Emanuele Bianchini, Winchester, MA (US)

(73) Assignee: Vibration-X, Inc., Winchester, MA (US)

( * ) Notice: Subject to any disclaimer, the term of this patent is extended or adjusted under 35 U.S.C. 154(b) by 281 days.

(21) Appl. No.: 12/295,993

(22) PCT Filed: Apr. 4, 2007

(86) PCT No.: PCT/EP2007/053286

§ 371 (c)(1), (2), (4) Date: Oct. 3, 2008

(87) PCT Pub. No.: WO2007/115992

PCT Pub. Date: Oct. 18, 2007

(65) Prior Publication Data

US 2009/0115288 A1 May 7, 2009

Related U.S. Application Data

(60) Provisional application No. 60/790,258, filed on Apr. 7, 2006.

(51) Int. Cl.
*H01L 41/08* (2006.01)

(52) U.S. Cl. ......................... 310/324; 310/330; 310/334

(58) Field of Classification Search .................. 310/322, 310/334–336, 324
See application file for complete search history.

(56) References Cited

U.S. PATENT DOCUMENTS

| | | | | |
|---|---|---|---|---|
| 5,283,835 | A | 2/1994 | Athanas | |
| 6,345,102 | B1 | 2/2002 | Davis et al. | |
| 6,449,376 | B1 | 9/2002 | Beltran et al. | |
| 6,720,708 | B2 | 4/2004 | Athanas | |
| 6,985,596 | B2 * | 1/2006 | Bank et al. | 381/152 |
| 2004/0189151 | A1 * | 9/2004 | Athanas | 310/328 |
| 2006/0013417 | A1 | 1/2006 | Bailey et al. | |
| 2006/0029240 | A1 * | 2/2006 | Bank et al. | 381/152 |

FOREIGN PATENT DOCUMENTS

WO WO 2006/016294 2/2006

* cited by examiner

*Primary Examiner* — Mark Budd

(74) *Attorney, Agent, or Firm* — MacMillan, Sobanski & Todd, LLC

(57) ABSTRACT

A full range loudspeaker, comprising a frame with a membrane secured onto said frame and a piezoelectric actuator attached on said membrane and able to be driven over the full audible frequency range.

17 Claims, 3 Drawing Sheets

PIEZOELECTRIC LOUDSPEAKER

This application is a §371 national phase filing of PCT/EP2007/053286 filed Apr. 4, 2007, and claims priority benefit of U.S. Provisional application No. 60/790,258 filed Apr. 7, 2006.

The present invention refers to a piezoelectric loudspeaker, and to a method to design and make a full range piezoelectric loudspeaker.

More particularly, the piezoelectric loudspeaker according to the invention has an improved low frequency response, and is able to be driven at a wide range of audio signal frequencies, e.g. from about 5 Hz up to 100 KHz.

STATE OF THE ART

Piezoelectric loudspeakers have been used in audio systems to generate high frequency audio sound (tweeters, ultrasonic sound generators, etc.), but they have never been used to cover the low frequency range, which is typically covered by a conventional voice coil speaker.

Sound system designers historically have used electromagnetic "voice coil" transducers to generate air displacement.

FIG. 1 discloses an embodiment of a prior art "voice coil" transducer 100. The transducer 100 consists of a suspended cone 101 that is pushed in and out by an attached voice coil 104, which moves through a magnetic field when current travels through the coil's windings.

The voice coil 104 is inserted in a magnet 103 on the top plate 102 of which is fixed the cone 101.

Such transducers are usually placed in an acoustic baffle of some sort, typically a sealed or ported box. The baffle keeps the pressure generated on the back side of the cone 101 from cancelling out the pressure on the front side, especially at low frequencies where the air molecules would otherwise just slosh back and forth around the edges of the cone. Without a baffle, the sloshing tends to greatly reduce the sound level in the transducer's low frequency range and also causes the transducer to radiate the pressure wave in a more directional or "beamy" manner like a flashlight.

While operating at lower frequencies, the transducer cone 101 tends to maintain its shape and move in and out as a rigid piston. As the driving frequency increases, the cone eventually hits a frequency at which it begins to "break up" or resonate in various structural modes. Conventional wisdom says that speakers driven within their break up region have poor quality sound because the resulting resonances create audible peaks and dips in the frequency response.

One method of dealing with cone break up is to mechanically damp out the resonant modes to minimize their influence. Another common method is to stop driving the transducer within its break-up region and instead "cross over" to another smaller transducer, which is still operating below its break up frequency.

This approach creates multi-transducer speakers that may include woofers (for low frequencies approximately 30-200 Hz), midrange transducers (for mid frequencies approximately 200-5.000 Hz) and tweeters (for high frequencies approximately 5.000-20.000 Hz). These speakers typically require additional electronic crossover components to direct the drive voltages at various frequencies to the specific transducer that will handle them. These speakers also are more prone to peaks or dips in the frequency response in the crossover region where two transducers may be operating at the same output level.

Piezoelectric materials are materials capable of converting electrical energy into mechanical energy and vice versa. Such materials can be used as sensors (mechanical input, electrical output), as actuators (electrical input, mechanical output) or as vibration control devices (active where power is supplied to the system and passive where the energy generated is dissipated by an electrical component). When a piezoelectric actuator is attached onto a structure and driven by an audio signal, the structure will be driven to vibrate in accordance with the audio signal input and the dynamic response characteristics of the structure itself.

The sound quality of a piezoelectric speaker is typically limited by the shape and size of the structure to which the piezoelectric material is attached. For this reason, prior use of piezoelectric materials used to generate audio sounds has been limited to single frequency audio sounds generators such as buzzers or alarm devices. In a single frequency device, the piezoelectric actuator is supported on an amplifying structure and is driven at a frequency that causes the amplifying structure to resonate at a natural frequency of the amplifying structure to generate a tone or a limited audio frequency band. There have been attempts to use a piezoelectric actuator driving an amplifying structure as a full range audio speaker, but the size and rigidity of the structure have made it difficult to obtain an acceptable low frequency sound response. Applicant has determined that in order to achieve a low frequency audio sound, e.g. approximately 30-50 Hz, the amplifying structure must be constructed with a first resonant frequency of below about 20 Hz.

Unlike conventional loudspeakers, piezoelectric speakers operate entirely within their break up mode region. For good results low frequency sound results, a piezoelectric actuator is used to excite the fundamental frequency of the amplifying structure. The fundamental frequency of an amplifying structure is the lowest frequency at which an appreciable displacement of the amplifying structure is generated by the piezoelectric speaker.

For good results at higher frequency, the amplifying structure needs enough closely spaced apart structural vibration modes to result in a smooth frequency response across the entire operating frequency region (i.e., no large peaks or dips in the frequency response where resonances either are not present or are overabundant). The complex surface displacement of the driven amplifying structure, resulting from the superposition of several vibrational modes at a given frequency, causes an air pressure wave to radiate away from the structure in very complex, multi-beam patterns. While some listeners notice no appreciable difference in this type of radiation, others say that this complex radiation sounds more "ambient" or "spacious" than traditional speakers do.

The object of the present invention is therefore to design and make a full range piezoelectric loudspeaker able to overcome the above problems and shortcomings.

Another object is to design a simple and inexpensive piezoelectric loudspeaker able to obtain high audio performance at low frequencies.

To obtain these objects the Applicant has studied and realized the present invention.

SUMMARY OF INVENTION

The present invention is set forth and characterized in the main claims, while the dependent claims describe other characteristics of the invention.

The present invention describes a novel way to extend the range of a piezoelectric loudspeaker to a low frequency range by the use of a specific material and a specific manufacturing process.

The novel piezoelectric loudspeaker according to the present invention comprises a piezoelectric transducer attached to a fabric amplifying structure comprising a thin fabric or cloth membrane supported by a frame member.

The fabric membrane attached to the frame is doped with a filler material such as epoxy resin or paint for stiffening the fabric material.

The size shape and doping levels of the fabric member are configured to provide the fabric member with a first resonant frequency of below 20 Hz. The fabric member may be, for example, that sold with the name of Dacron®.

Before, during or after the coating (by brush or spray painting) of the fabric with the doping material, the fabric is heated, e.g. by a hair dryer, to conform to the frame member shape.

According to a preferred embodiment, the material can be further doped and coated (brush or spray painting) to obtain a finished look and good audio performance.

According to a variant, the layer of paint may have different densities and/or thickness, and/or being coated only in selected areas throughout the surface of the membrane in order to obtain different audio performance.

According to the invention, one or more piezoelectric actuators are then attached or integrated into the cloth material, either as fibres or as piezoceramic plates. The piezoelectric material may be further realized in a single- or multi-layer form.

This method will not only allow for an integrated design, but it will also provide great flexibility in the frequency ranges to be covered.

The key features of this invention are:

driving of piezoelectric speaker in the low frequency range, also as a subwoofer;

no need for voice coil driven loudspeaker to cover the low frequency range;

the membrane material is water resistant and temperature resistant, making the overall device feasible for both automotive and outdoors applications;

the device can be invisible to the eye, or at least concealed to the user;

the device can take on any desired shape by building an appropriate frame for it;

piezoelectric speaker provide greater "ambient" and "spacious" sound due to the complex radiation patterns created by actuating higher order modes;

different coatings can be applied to the membrane material to change the mechanical and acoustic properties of the speaker.

The advantages of this approach over other available methods include:

integrated design, invisibility, lower part count, lightweight design, no added magnetic field created.

Careful consideration has to be provided to substantially match the stiffness of the membrane so obtained by the cloth, the resin and the paint, with the stiffness of the piezoelectric actuator, so that the actuator itself does not compromise the structural dynamic properties of the fabric membrane and degrade the acoustic properties of the system. The thickness of the piezoelectric device is optimized so that it will still exert actuation to the membrane without locally stiffening the structure. Accordingly, the structural rigidity of the doped fabric membrane is matched to that of the piezoelectric material used to drive the structure.

In one example of the invention, the cloth element is made of woven Dacron® and is doped with a layer of butyrate epoxy applied over the cloth. A piezoelectric actuator is mounted onto the fabric approximately at the centre of the fabric element. The piezoelectric actuator can be a PZT 5-A type piezoelectric material. Finite element and boundary element analysis can be used to optimize the location of the actuators within specific speaker geometry. If two actuators are used to locally sandwich the membrane, then a bimorph type actuator is constructed. Such a combination can provide high overall sound output.

Applicant has found that using the above structure with a rectangular frame 30×90 cm, could be reproduced acceptable audible sound ranging from 50 Hz to up to about 10.000 Hz with good results.

Using the same membrane and a rectangular frame 7.5×12.5 cm, could be reproduced acceptable audible sound ranging from 1000 Hz up to about 10.000 Hz with good results.

The cost of the piezoelectric actuator is minimal with respect to the rest of the system. Preliminary information indicates that the cost of the integrated piezoelectric actuator is less than a conventional voice coil loudspeaker. Several manufacturing steps can be automated in order to reduce labour costs. Additionally, the weight added by the piezoelectric actuator is well below that of a voice coil speaker.

Due to the membrane material and the manufacturing process used, the piezoelectric actuator could drive a very efficient membrane, hence making the speaker play with good sound quality at all frequencies, including the low frequency band. The shape of the response can be further optimized by modifying the number and location of the actuators. Also, it can be noticed that minimal distortion is introduced in the low frequency range by the presence of the piezoelectric actuator.

BRIEF DESCRIPTION OF THE DRAWINGS

These and other characteristics of the present invention will become apparent from the following description of a preferential form of embodiment, given as a non-restrictive example with reference to the attached drawings, wherein.

DETAILED DESCRIPTION OF THE PREFERRED EMBODIMENT

Figure 4:
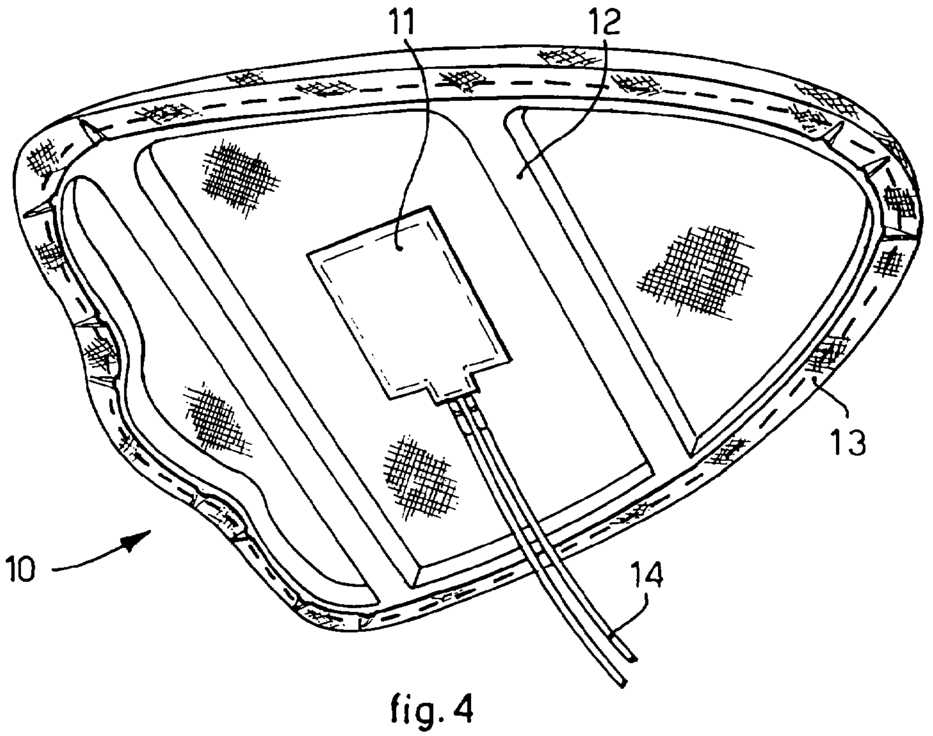
FIG. 4 shows the rear side of an embodiment of a piezoelectric loudspeaker according to the invention.
Figure 5:
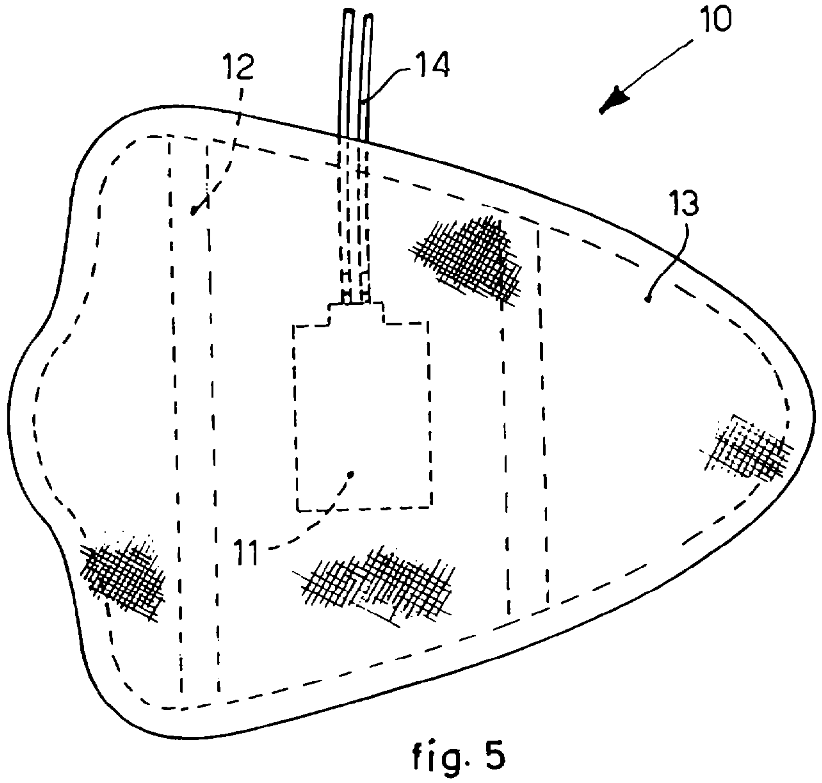
FIG. 5 shows the front side of the piezoelectric loudspeaker of FIG. 4.

The piezoelectric loudspeaker 10 according to the invention is shown in a form of embodiment in FIGS. 4 and 5.

In this form of embodiment, the loudspeaker 10 includes a single small piezoelectric actuator 11, but it is clear that it could as well include a multiplicity of piezoelectric actuators distributed on the surface of the panel. The number and the distribution of the piezoelectric actuators 11 on the surface of the loudspeaker 10 may be designed according to the specific application and the audio performance to be obtained.

Figure 6:
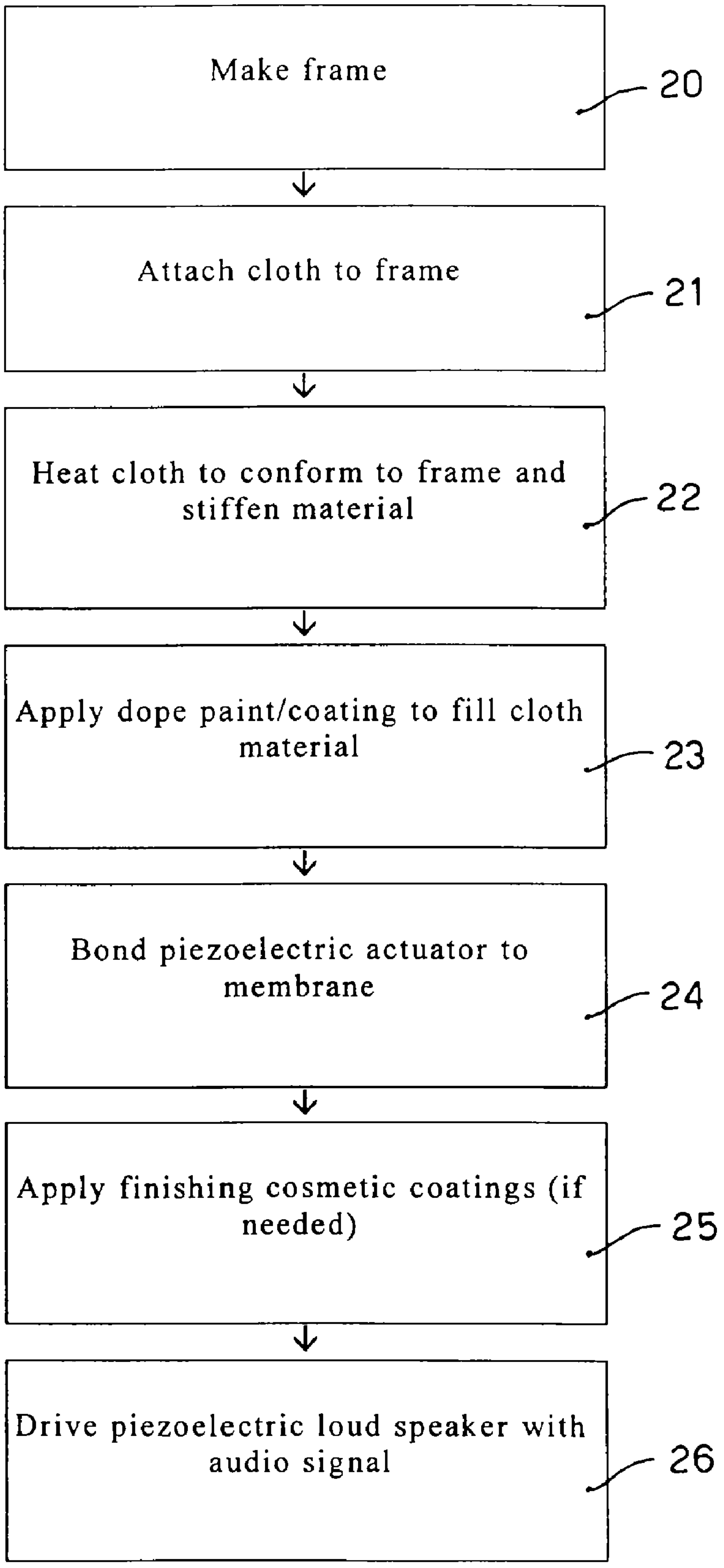
FIG. 6 shows a block diagram of the manufacturing steps required to make the piezoelectric driven loudspeaker.

The loudspeaker 10 comprises, as its essential components, a thin frame 12 (see step 20 in the block diagram of FIG. 6) which can have a suitable shape according to the needed requirements for the installation. In addition, the frame member may comprise any opening formed in a solid structure that the fabric membrane can be stretched across. One example is an opening formed in an automobile dashboard or door panel. Another example is an opening in a wall or ceiling panel.

Furthermore, the material for the frame may be chosen from a great variety of materials, for example wood, plastics, metal, alloys, composite materials.

On the perimeter of the frame 12 is attached (step 21) a thin cloth 13, which is made from a shrinkable material, for example, that sold with the name of Dacron®.

The cloth 13 may be attached to the frame 11 with any suitable manner, for example by stapling, glueing, spot welding, or other.

In a form of embodiment not shown, the frame 12 may be realized in at least two shells which can be coupled each other in order to block between them the cloth 13 in a fixed position.

After that, heat is applied to the assembly in order to conform the cloth 13 to the shape of the frame 11 and stiffen the cloth 13 itself (step 22).

The step of heating the fabric membrane may be performed by blowing hot air on the fabric or heating the frame and fabric in an oven.

Then, at least a layer of resin is applied on the surface of the cloth 13 (step 23).

The step of applying the doping material may be done when the fabric is at an elevated temperature of the doping material may be heated when it is applied.

The layer of resin has the function to stiffen the material obtaining a substantially rigid and tensioned membrane. Moreover, the resin completely fills the gaps and the pores of the cloth 13, creating a non-transpirating and rigid layer.

The doping may be applied to one or both the sides of the fabric membrane.

In addition, the doping material may be applied before the fabric membrane is mounted onto the frame such as manufactured as a pre-doped material.

A layer of paint or other suitable coating may be further applied to create the desired conditions for audio performance. The paint or coating may be applied with different densities, different thicknesses or in selected areas on the surface of the cloth 13 according to specific design and audio performance to be obtained.

Figure 1:
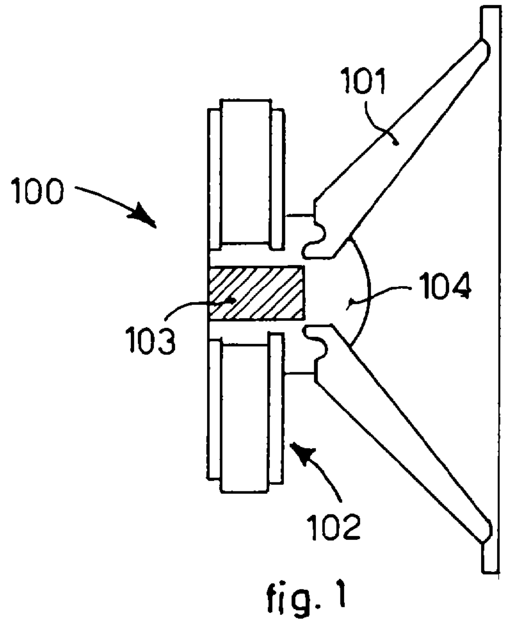
FIG. 1 shows a prior art "voice coil" transducer.
Figure 2:
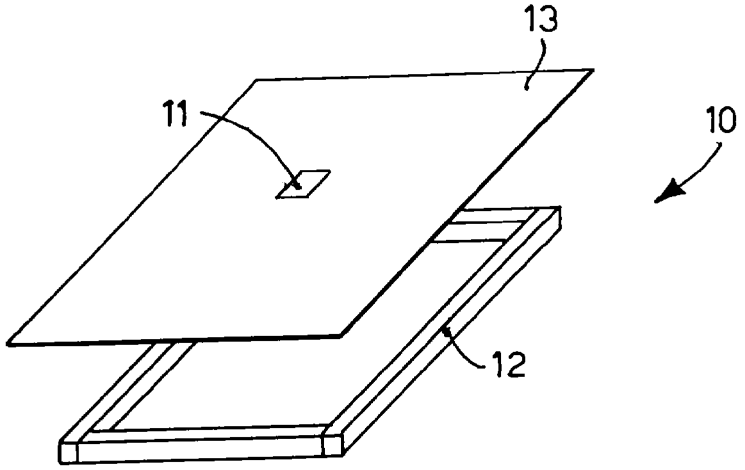
FIG. 2 shows a diagram of the different components used in the assembly process.
Figure 3:
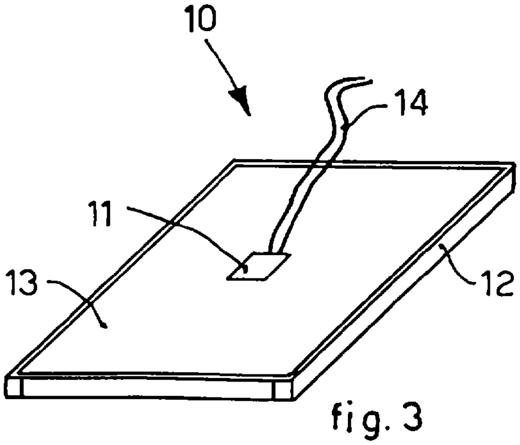
FIG. 3 shows a diagram of the assembled piezoelectric loudspeaker.

Finally, the piezoelectric actuator 11 is attached on the membrane so obtained (step 24—see also FIGS. 3 and 4). As already explained before, the loudspeaker 10 may comprise one or more piezoelectric actuators 11 suitably distributed on the surface of the membrane. The piezoelectric actuator 11 may be already fitted with the connecting cables 14 for the connection to the sound producing equipment (not shown).

A further step 25 may comprise the application of a finishing and/or colouring cosmetic coating, if needed or desired to complete the appearance of the loudspeaker 10, or to obtain an environmental protection, or to further improve the audio performance of the loudspeaker 10.

The loudspeaker 10 is so ready to be driven with the audio signal as produced by the connected equipment—step 26. When the loudspeaker 10 is driven, the piezoelectric actuators 11 can be driven in and out of phase to obtain the desired response.

It is obvious that modifications and/or additions of parts can be made to the loudspeaker 10 and method as described heretofore without departing from the spirit and scope of the present invention.

For example, the piezoelectric actuator 11 may be packaged by a protective layer with integrated electrical connection 14, in order to protect it from environmental damages and shocks. Moreover, the loudspeaker 10 may be associated with a transformer to step up the voltage to the piezoelectric actuators 11.

Furthermore, the loudspeaker may comprise a LED in parallel with the piezoelectric actuator 11 for providing visual feedback to the listener.

The loudspeaker 10 according to the present invention may be applied, other than in conventional applications with sound-producing equipments, also in different applications, as for example in conduits for air-conditioning.

The invention claimed is:

1. A loudspeaker comprising:
- a frame;
- a membrane secured to the frame; and
- at least one piezoelectric actuator attached to said membrane, said at least one piezoelectric actuator having inputs,
- said membrane operative in conjunction with said at least one piezoelectric actuator to produce an audible output ranging in frequency from about 1000 Hz or less to about 10000 Hz in response to application of an electrical signal to said inputs that extends at least across said frequency range,
- wherein said at least one piezoelectric actuator further includes at least one light emitting diode electrically coupled to said at least one piezoelectric actuator to provide a visual indication in response to actuation of said at least one piezoelectric actuator.

2. The loudspeaker of claim 1 wherein said membrane is operative in conjunction with said at least one piezoelectric actuator to produce an audible output ranging in frequency from about 50 Hz to about 10000 Hz in response to application of an electrical signal to said inputs that extends at least across said frequency range.

3. The loudspeaker of claim 1 wherein said at least one piezoelectric actuator includes a plurality of piezoelectric actuators.

4. The loudspeaker of claim 1 wherein said membrane comprises a heat shrinkable material.

5. The loudspeaker of claim 4 wherein said heat shrinkable material is Dacron®.

6. The loudspeaker of claim 1 wherein said membrane is at least partially coated with a coating material.

7. The loudspeaker of claim 6 wherein the coating material is a stiffening epoxy resin.

8. The loudspeaker of claim 6 wherein the coating material is a paint.

9. The loudspeaker of claim 6 wherein the coating material is a material that provides environmental protection for said membrane.

10. The loudspeaker of claim 6 wherein the coating material, following coating of said membrane, creates a first resonant frequency for the coated membrane of below 20 Hz.

11. The loudspeaker of claim 1 further including a protective coating layer over said at least one piezoelectric actuator.

12. The loudspeaker of claim 1 further including a transformer having outputs coupled to the inputs of said at least one piezoelectric actuator, said transformer configured to step up the voltage applied to said at least one piezoelectric actuator.

13. The loudspeaker of claim 1 wherein said at least one piezoelectric actuator comprises piezoelectric fibers.

14. The loudspeaker of claim 1 wherein said at least one piezoelectric actuator comprises a ceramic piezoelectric actuator.

15. The loudspeaker of claim 1 wherein said at least one piezoelectric actuator includes at least one multilayer piezoelectric actuator.

16. A loudspeaker comprising:

a frame;

a membrane secured to the frame, the membrane having a stiffness characteristic; and at least one piezoelectric actuator attached only to said membrane, said at least one piezoelectric actuator having a stiffness characteristic that substantially matches the membrane stiffness characteristic, said membrane operative in conjunction with said at least one piezoelectric actuator to produce an audible output ranging in frequency from about 1000 Hz or less to about 10000 Hz.

17. A loudspeaker comprising:

a frame;

a membrane comprising a fabric stiffened with a doping compound, the membrane being stretched and secured to the frame and having a thickness; and at least one piezoelectric actuator carried by said membrane, said at least one piezoelectric actuator having inputs, the piezoelectric actuator having a thickness that is within a range of one to two times the thickness of the membrane, said membrane operative in conjunction with said at least one piezoelectric actuator to produce an audible output ranging in frequency from about 1000 Hz or less to about 10000 Hz in response to application of an electrical signal to said inputs that extends at least across said frequency range.

* * * * *